(12) United States Patent
Cho et al.

(10) Patent No.: US 11,418,877 B2
(45) Date of Patent: Aug. 16, 2022

(54) ELECTRONIC APPARATUS AND CONTROLLING METHOD THEREOF

(71) Applicant: SAMSUNG ELECTRONICS CO., LTD., Suwon-si (KR)

(72) Inventors: Jaeyoun Cho, Suwon-si (KR); Hyeonsik Jeong, Suwon-si (KR); Byeonggeun Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/088,144

(22) Filed: Nov. 3, 2020

(65) Prior Publication Data

US 2021/0160614 A1 May 27, 2021

(30) Foreign Application Priority Data

Nov. 21, 2019 (KR) .................. 10-2019-0150741

(51) Int. Cl.
| | |
|---|---|
| *H04R 3/00* | (2006.01) |
| *G10L 21/00* | (2013.01) |
| *G10K 11/16* | (2006.01) |
| *H04R 3/02* | (2006.01) |

(Continued)

(52) U.S. Cl.
CPC ........... *H04R 3/02* (2013.01); *G10K 11/1787* (2018.01); *G10L 21/0208* (2013.01)

(58) Field of Classification Search
CPC . H04R 3/00; H04R 3/005; H04R 3/04; H04R 3/12; G10L 21/00; G10L 21/02; G10L 21/0208; G10L 21/0224; G10L 2021/02163; G10L 2021/02165; G10L 2021/02166; G10L 15/20; G10K 11/16; G10K 11/1787; G10K 11/17873;

(Continued)

(56) References Cited

U.S. PATENT DOCUMENTS

| | | | | |
|---|---|---|---|---|
| 5,353,348 | A | * 10/1994 | Sendyk | ................. H04M 9/082 370/288 |
| 6,519,559 | B1 | 2/2003 | Sirivara | |
| 6,993,480 | B1 | 1/2006 | Klayman | |

(Continued)

FOREIGN PATENT DOCUMENTS

| | | |
|---|---|---|
| CN | 104685563 A | 6/2015 |
| EP | 1 833 163 A1 | 9/2007 |

(Continued)

OTHER PUBLICATIONS

International Search Report dated Feb. 18, 2021 issued by the International Searching Authority in International Application No. PCT/KR2020/014727 (PCT/ISA/210).

(Continued)

*Primary Examiner* — Thang V Tran
(74) *Attorney, Agent, or Firm* — Sughrue Mion, PLLC

(57) ABSTRACT

An electronic apparatus is provided. The electronic apparatus includes a microphone and a processor configured to, based on a second sound including a first sound of an audio signal being received through the microphone, obtain a noise about the electronic apparatus based on the audio signal and the second sound, obtain an enduring component of the noise, and based on the enduring component being equal to or greater than a threshold value, process the audio signal.

18 Claims, 19 Drawing Sheets

(51) Int. Cl.
*G10K 11/178* (2006.01)
*G10L 21/0208* (2013.01)

(58) Field of Classification Search
CPC ....... G10K 11/17875; G10K 11/17879; G10K 11/17881
See application file for complete search history.

(56) References Cited

U.S. PATENT DOCUMENTS

| | | | |
|---|---|---|---|
| 8,744,091 B2 | 6/2014 | Chen et al. | |
| 9,094,078 B2 | 7/2015 | Lee et al. | |
| 9,208,766 B2 | 12/2015 | Su et al. | |
| 9,866,955 B2 | 1/2018 | Kleijn et al. | |
| 9,998,839 B2 | 6/2018 | Lee et al. | |
| 10,299,052 B2 | 5/2019 | Lee et al. | |
| 10,999,687 B2 | 5/2021 | Lee et al. | |
| 11,159,903 B2 | 10/2021 | Lee et al. | |
| 2003/0076948 A1* | 4/2003 | Nishimura | H04M 9/082 379/406.01 |
| 2007/0033020 A1 | 2/2007 | Francois et al. | |
| 2008/0137874 A1 | 6/2008 | Christoph | |
| 2009/0003586 A1* | 1/2009 | Lai | H04M 9/082 379/406.01 |
| 2009/0106021 A1 | 4/2009 | Zurek et al. | |
| 2011/0142256 A1 | 6/2011 | Lee et al. | |
| 2011/0150067 A1* | 6/2011 | Takada | H04M 9/082 375/227 |
| 2013/0158989 A1 | 6/2013 | Song et al. | |
| 2014/0236590 A1* | 8/2014 | Hu | G10L 21/0208 704/228 |
| 2015/0124986 A1* | 5/2015 | Li | G10L 21/02 381/66 |
| 2016/0035366 A1* | 2/2016 | Matsuo | G10L 21/02 381/66 |
| 2017/0257715 A1 | 9/2017 | Lee et al. | |
| 2018/0077290 A1* | 3/2018 | Zargar | H04B 3/234 |
| 2018/0332174 A1* | 11/2018 | Kawai | H04R 1/2869 |
| 2018/0332414 A1 | 11/2018 | Lee et al. | |
| 2019/0239010 A1 | 8/2019 | Lee et al. | |
| 2020/0076389 A1 | 3/2020 | Jeong et al. | |
| 2020/0404438 A1 | 12/2020 | Lee et al. | |

FOREIGN PATENT DOCUMENTS

| | | |
|---|---|---|
| EP | 3 461 146 A1 | 3/2019 |
| JP | 2007-251733 A | 9/2007 |
| JP | 5726709 B2 | 6/2015 |
| KR | 10-2011-0068637 A | 6/2011 |
| KR | 10-1312451 B1 | 9/2013 |
| KR | 10-2016-0097824 A | 8/2016 |
| KR | 10-2016-0102713 A | 8/2016 |
| KR | 10-1888426 B1 | 8/2018 |
| KR | 10-2020-0026575 A | 3/2020 |
| KR | 10-2248071 B1 | 5/2021 |
| WO | 2017/086353 A1 | 5/2017 |

OTHER PUBLICATIONS

Written Opinion dated Feb. 18, 2021 issued by the International Searching Authority in International Application No. PCT/KR2020/014727 (PCT/ISA/237).
Communication dated Mar. 26, 2021 issued by the European Patent Office in European Application No. 20204386.5.

* cited by examiner enduring component of e time(sec)

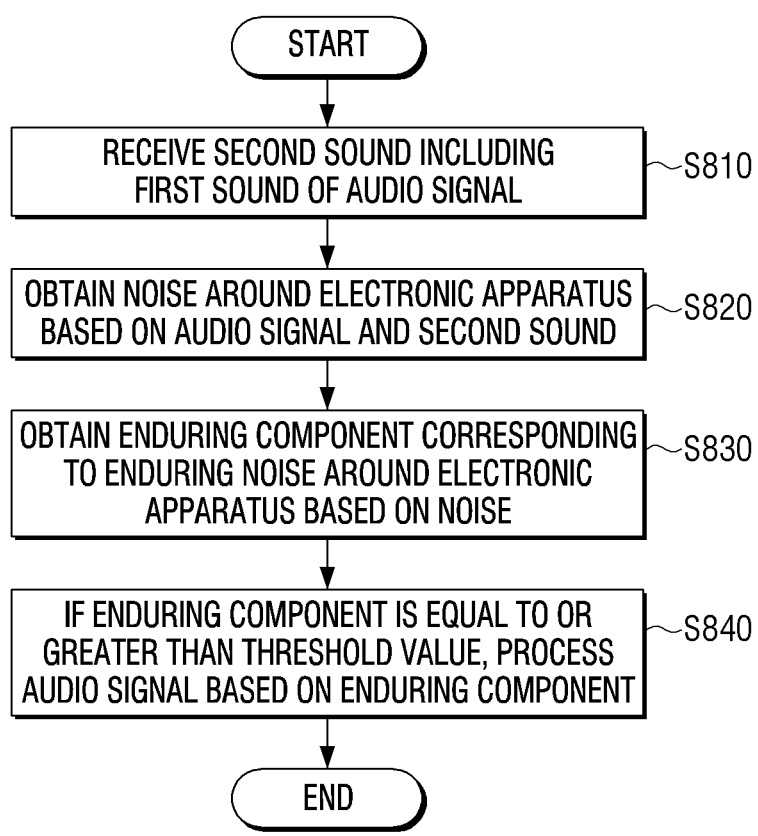

ELECTRONIC APPARATUS AND CONTROLLING METHOD THEREOF

CROSS-REFERENCE TO RELATED APPLICATION(S)

This application claims priority from Korean Patent Application No. 10-2019-0150741, filed in the Korean Intellectual Property Office on Nov. 21, 2019, the disclosure of which is incorporated herein by reference.

BACKGROUND

1. Field

Embodiments of the disclosure relate to an electronic apparatus and a controlling method thereof and more particularly, to an electronic apparatus that processes an audio signal and a controlling method thereof.

2. Description of Related Art

Recently, various multimedia devices have been developed to provide various contents and experiences to users. In particular, multimedia devices are aimed to provide users with better image quality and sound quality. Therefore, multimedia devices are equipped with complicated and diverse functions related to audio reproduction. For example, multimedia devices are equipped with various equalizers, stereoscopic sound and effect sound functions.

Despite such functions, noise may cause interference when users view a multimedia content, and the users may not recognize the sound of the multimedia content.

Accordingly, there is a need for an electronic apparatus that effectively adjusts an audio signal according to a noise state.

SUMMARY

One or more embodiments of the disclosure provide an electronic apparatus for improving a transmission power of an audio signal and a controlling method thereof.

According to an aspect of an example embodiment, provided is an electronic apparatus including: a microphone; and a processor configured to: based on a second sound, including a first sound of an audio signal, being received through the microphone, obtain a noise about the electronic apparatus based on the audio signal and the second sound; obtain an enduring component of the noise; and based on the enduring component being equal to or greater than a threshold value, process the audio signal.

The processor may be further configured to: obtain a plurality of noises corresponding to a plurality of time sections based on the audio signal and the second sound; and obtain an enduring component of a first time section, among the plurality of time sections, that is a most recent time section based on the plurality of noises.

The processor may be further configured to obtain a plurality of powers respectively corresponding to the plurality of noises, and obtain a power having a smallest value from among the plurality of powers as the enduring component of the first time section.

The electronic apparatus may further include: a memory configured to store information on the plurality of powers, wherein the processor is further configured to: obtain a noise in a second time section, the second time section being immediately after the first time section; obtain a power of the second time section based on the noise in the second time section; and obtain, as an enduring component of the second time section, a power having a smallest value from powers excluding a power of an oldest time section from among the plurality of powers stored in the memory and a power of the second time section.

The processor may be further configured to: store the power of the second time section in the memory; and delete the power of the oldest time section from among the plurality of powers stored in the memory.

The electronic apparatus may further include a speaker, and the processor may be further configured to output the first sound through the speaker.

The processor may be further configured to: obtain a predicted sound corresponding to the audio signal by applying an adaptive filter to the audio signal; and obtain the noise by subtracting the predicted sound from the second sound, wherein the adaptive filter is obtained based on a relation between an output sound of the speaker and an input sound of the microphone.

The processor may be further configured to change the threshold value based on at least one of the first sound, the second sound, the predicted sound, or the noise.

The processor may be further configured to: based on the enduring component being equal to or greater than the threshold value, process the audio signal by performing at least one of channel redistribution of the audio signal, gain adjustment of at least one of a plurality of channels, or enhancement of a voice component; and output a third sound corresponding to the processed audio signal.

The processor may be further configured to, based on an enduring component obtained while the third sound is output being less than the threshold value, stop or change processing of the audio signal.

According to an aspect of an example embodiment, provided is a method of controlling an electronic apparatus, including: receiving a second sound, including a first sound of an audio signal; obtaining a noise about the electronic apparatus based on the audio signal and the second sound; obtaining an enduring component based on the noise; and based on the enduring component being equal to or greater than a threshold value, processing the audio signal.

The obtaining the noise may include obtaining a plurality of noises corresponding to a plurality of time sections based on the audio signal and the second sound, and the obtaining the enduring component may include obtaining an enduring component of a first time section, among the plurality of time sections, that is a most recent time section based on the plurality of noises.

The obtaining an enduring component may include obtaining a plurality of powers respectively corresponding to the plurality of noises, and obtaining a power having a smallest value from among the plurality of powers as the enduring component of the first time section.

The method may further include: obtaining a noise in a second time section, the second time section being immediately after the first time section; obtaining a power of the second time section based on the noise in the second time section; and obtaining, as an enduring component of the second time section, a power having a smallest value from powers excluding a power of an oldest time section from among the plurality of powers and a power of the second time section.

The method may further include: storing the power of the second time section in a memory of the electronic apparatus; and deleting the power of the oldest time section from among the plurality of powers stored in the memory.

The method may further include outputting the first sound through a speaker of the electronic apparatus.

The obtaining the noise may include: obtaining a predicted sound corresponding to the audio signal by applying an adaptive filter to the audio signal; and obtaining the noise by subtracting the predicted sound from the second sound, wherein the adaptive filter is obtained based on a relation between an output sound of the speaker and an input sound of a microphone of the electronic apparatus.

The obtaining the noise further may include changing the threshold value based on at least one of the first sound, the second sound, the predicted sound, or the noise.

The processing the audio signal may include performing at least one of channel redistribution of the audio signal, gain adjustment of at least one of a plurality of channels, or enhancement of a voice component, the method further including outputting a third sound corresponding to the processed audio signal.

The method may further include based on an enduring component obtained while the third sound is output being less than the threshold value, stopping or changing the processing the audio signal.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 8 is a flowchart to explain a method of controlling an electronic apparatus according to an embodiment.

DETAILED DESCRIPTION

Figure 1:
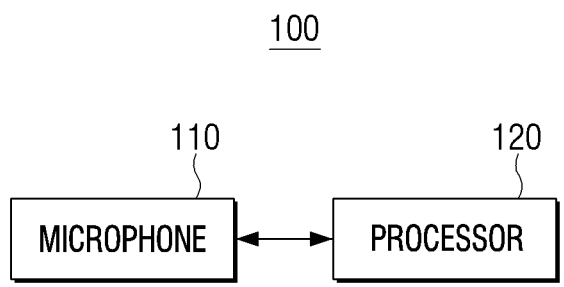
FIG. 1 is a block diagram illustrating a configuration of an electronic apparatus according to an embodiment.

Hereinafter, certain embodiments according to the disclosure will be described in detail with reference to the accompanying drawings. The example embodiments of the present disclosure may be diversely modified. Accordingly, while specific example embodiments are illustrated in the drawings and are described in detail in the detailed description, it is to be understood that the present disclosure is not limited to a specific embodiment, but includes all modifications, equivalents, and substitutions without departing from the scope and spirit of the present disclosure. Also, well-known functions or constructions are not described in detail since they would obscure the disclosure with unnecessary detail.

General terms that are currently widely used were selected as terms used in embodiments of the disclosure in consideration of functions in the disclosure, but may be changed depending on the intention of those skilled in the art or a judicial precedent, the emergence of a new technique, and the like. In addition, in a specific case, terms arbitrarily chosen by an applicant may exist. In this case, the meaning of such terms will be mentioned in detail in a corresponding description portion of the disclosure. Therefore, the terms used in embodiments of the disclosure are to be defined on the basis of the meaning of the terms and the contents throughout the disclosure rather than simple names of the terms.

In the specification, an expression "have", "may have", "include", "may include", or the like, indicates existence of a corresponding feature (for example, a numerical value, a function, an operation, a component such as a part, or the like), and does not exclude existence of an additional feature.

Expressions such as "at least one of A and B", "at least one of A or B", and "at least one of A and/or B" are to be understood to represent "A" or "B" or "any one of A and B".

Expressions "first", "second", or the like, used in the specification may indicate various components regardless of a sequence and/or importance of the components, will be used only to distinguish one component from the other components, and do not limit the corresponding components.

Singular forms are intended to include plural forms unless the context clearly indicates otherwise. It will be further understood that terms "include" or "formed of" used in the specification specify the presence of features, numerals, steps, operations, components, parts, or combinations thereof mentioned in the specification, but do not preclude the presence or addition of one or more other features, numerals, steps, operations, components, parts, or combinations thereof.

In the disclosure, a term "user" may refer to a person using an electronic apparatus or an apparatus (for example, an artificial intelligence electronic apparatus) using an electronic apparatus.

Hereinafter, an embodiment of the disclosure will be described in detail with reference to the accompanying drawings.

FIG. 1 is a block diagram illustrating a configuration of an electronic apparatus 100 according to an embodiment.

The electronic apparatus 100 is an apparatus that processes an audio signal, and may be an apparatus such as a television (TV), a desktop personal computer (PC), a notebook computer, a smartphone, a tablet PC, smart glasses, a smart watch, a set-top box (STB), a computer main body, etc. However, the electronic apparatus 100 is not limited thereto, and may be any apparatus capable of processing an audio signal.

Referring to FIG. 1, the electronic apparatus 100 includes a microphone 110 and a processor 120. However, the electronic apparatus 100 is not limited thereto, and the electronic apparatus 100 may be implemented in a form in which some components are excluded.

The microphone 110 is configured to receive a sound and convert the sound into an audio signal. The microphone 110 may be electrically connected to the processor 120, and receive a sound under the control of the processor 120. Here, the sound may include a sound generated from at least one of the electronic apparatus 100 and one or more external apparatuses around the electronic apparatus 100 and may include a noise around or about the electronic apparatus 100.

In an embodiment, the microphone 110 may be formed to be integrated with the electronic apparatus 100, for example, in an upper portion of the electronic apparatus 100, in a front portion of the electronic apparatus 100, a lateral portion of the electronic apparatus 100, etc. Alternatively, the microphone 110 may be provided in a remote controller separate from the electronic apparatus 100. In this case, the remote controller may receive a sound through the microphone 110, and provide the received sound to the electronic apparatus 100.

The microphone 110 may include various components such as a microphone for collecting a sound in an analog form, an amplifier circuit for amplifying the collected sound, an analog to digital (A/D) conversion circuit for sampling the amplified sound and converting the sampled sound into a digital signal, a filter circuit for removing a noise component from the converted digital signal, etc.

The microphone 110 may include a plurality of sub microphones. For example, the microphone 110 may include sub microphones in front, rear, left and right portions of the electronic apparatus 100, respectively. However, the microphone 110 is not limited thereto, and the electronic apparatus 100 may include only one microphone 110.

The microphone 110 may be implemented in the form of a sound sensor.

The processor 120 controls the overall operations of the electronic apparatus 100.

According to an embodiment, the processor 120 may be implemented as a digital signal processor (DSP), a microprocessor, and/or a time controller (TCON). However, the processor 120 is not limited thereto, and may be configured to include one or more of a central processing unit (CPU), a micro controller unit (MCU), a micro processing unit (MPU), a controller, an application processor (AP) or a communication processor (CP), or an advanced reduced instruction set computer (RISC) machines (ARM) processor, or may be defined as the corresponding term. In addition, the processor 120 may be implemented as a system on chip or a large scale integration (LSI) embedded with a processing algorithm, or in the form of a field programmable gate array (FPGA).

The processor 120 may receive a second sound including a first sound of an audio signal through the microphone 110. For example, the processor 120 may receive, through the microphone 110, the second sound including the first sound output from the electronic apparatus 100. In this case, the electronic apparatus 100 may further include a speaker (not illustrated), and the processor 120 may output the first sound through the speaker. Alternatively, the processor 120 may receive, through the microphone, the second sound including the first sound output from one or more external electronic apparatuses. For example, the electronic apparatus 100 may be an apparatus such as a set-top box, which provides an audio signal to a TV or a speaker so that the first sound corresponding to the audio signal is output.

Here, the audio signal means data stored in the electronic apparatus 100 and/or one or more external electronic apparatuses, and the electronic apparatus 100 may store the audio signal not only when the electronic apparatus 100 directly outputs the first sound but also when the first sound is output from one or more external electronic apparatuses. The first sound corresponds to a signal output through a speaker, etc., and the second sound may include the first sound and a noise around or about the electronic apparatus 100.

When the second sound is received, the processor 120 may obtain a noise around or about the electronic apparatus 100 based on an audio signal and the second sound. For example, when the second sound is received, the processor 120 may obtain a noise around or about the electronic apparatus 100 by removing a sound component corresponding to the audio signal from the second sound. For example, the processor 120 may obtain a predicted sound corresponding to the audio signal by applying an adaptive filter to the audio signal, and obtain a noise by differentiating the predicted sound from the second sound. Here, the adaptive filter may be a filter obtained based on a relationship between an output sound of a speaker and an input sound input to the microphone 110.

However, the present disclosure is not limited thereto, and the processor 120 may obtain a noise around or about the electronic apparatus 100 by using any other methods based on the audio signal and the second sound.

The processor 120 may obtain a plurality of noises in a predetermined time unit based on the audio signal and the second sound. For example, when the second sound is received, the processor 120 may obtain a noise around or about the electronic apparatus 100 by removing a sound component corresponding to the audio signal from the second sound in units of time of 64 ms. In other words, the processor 120 may obtain a noise during a first time section by removing a sound component corresponding to the audio signal from the second sound received during the first time section of 64 ms. Subsequently, the processor 120 may obtain a noise during a second time section by removing a sound component corresponding to the audio signal from the second sound received during the second time section of 64 ms immediately after the first time section. Here, the sound component corresponding to the audio signal in a time section may be a sound component received during the same time section. The processor 120 may obtain a plurality of noises corresponding to a plurality of time sections by repeating the above-described operation.

The processor 120 may obtain an enduring component corresponding to a noise that endures around or about the electronic apparatus 100 based on the noise. For example, the processor 120 may obtain a plurality of noises in a predetermined time unit (or a time section), and obtain an enduring component of the first time section which is the most recent time section based on one of the plurality of noises.

For example, the processor 120 may calculate a plurality of powers corresponding to a plurality of noises, and obtain a power having the smallest value from among the plurality of powers as an enduring component of the first time section.

Here, the electronic apparatus 100 may further include a memory (not illustrated), and the processor 120 may store information on the plurality of powers in a memory. The processor 120 may obtain a noise in the second time section immediately after the first time section, calculate a power of the second time section based on a noise of the second time section, and obtain a power having the smallest value from powers while excluding a power of the oldest time section from among the plurality of powers stored in the memory and the power of the second time section as an enduring component of the second time section.

When the power of the second time section is calculated, the processor 120 may store the power of the second time section in the memory, and delete the power of the oldest time section from among the plurality of powers stored in the memory.

Here, a number of powers to be stored in the memory may be preset, for example, 15, and when a new time section arrives, a newly calculated power corresponding to the new time section may be additionally stored, and the power of the oldest time section may be deleted.

However, the present disclosure is not limited thereto, and the processor 120 may obtain an enduring component in any other methods. For example, the processor 120 may obtain an enduring component based on at least one of a pattern or a period of the plurality of noises. Alternatively, the processor 120 may obtain an enduring component based on a frequency of the plurality of noises. For example, the processor 120 may divide each of the plurality of noises into a plurality of frequency sections, and obtain an enduring component based on a power of each of the plurality of frequency sections.

The processor 120 may process an audio signal based on an enduring component when the enduring component is equal to or greater than a threshold value. For example, if an enduring component is equal to or greater than a threshold value, the processor 120 may perform at least one of channel redistribution of the audio signal, gain control of at least one of a plurality of channels or enhancement of a voice component, and output a third sound corresponding to the processed audio signal through a speaker.

Here, the processor 120 may change the threshold value based on at least one of the first sound, the second sound, a predicted sound or a noise. For example, the processor 120 may increase the size of the threshold value based on the size of the second sound. Various examples thereof will be described later with reference to the corresponding drawings.

If a subsequent enduring component obtained while outputting the third sound is less than the threshold value, the processor 120 may stop or change the processing performed to obtain the third sound. For example, if a previous enduring component is equal to or greater than the threshold value, the processor 120 may output the third sound in which a voice component is enhanced. If a newly obtained enduring component is less than the threshold value, the operation of enhancing the voice component may be stopped. Alternatively, if the threshold value that was equal to or less than the previous enduring component is updated to be greater than the previous enduring component, the processor 120 may stop the operation of enhancing the voice component.

The function related to an artificial intelligence according to an embodiment is operated through the processor 130 and the memory.

The processor 120 may be implemented as one or a plurality of processors. The one processor or the plurality of processors may be a general-purpose processor such as a CPU, an AP, a Digital Signal Processor (DSP), etc., a graphic-only processor such as a graphics processing unit (GPU), and a vision processing unit (VPU), or an artificial intelligence (AI)-only processor such as a neural processing unit (NPU).

The one processor or the plurality of processors control to process input data according to a pre-defined operation rule or an artificial intelligence model stored in the memory. If the one processor or the plurality of processors are an AI-only processor, the AI-only processor may be designed in a hardware structure specialized for processing a specific artificial intelligence model. The pre-defined operation rule or the artificial intelligence model is characterized by being created through learning.

Here, being created through learning means that a pre-defined operation rule or an artificial intelligence model is created to perform a desired characteristic (or purpose) as a basic artificial intelligence model is trained by a learning algorithm using a plurality of learning data. Such learning may be conducted in an apparatus itself where artificial intelligence according to an embodiment is performed, or may be conducted through a separate server and/or system. The examples of the learning algorithm include supervised learning, unsupervised learning, semi-supervised learning or reinforcement learning, but are not limited thereto.

The artificial intelligence model may include a plurality of neural network layers. Each of the plurality of neural network layers has a plurality of weight values, and performs a neural network operation through operation between a result of operation of the previous layer and the plurality of weight values. The plurality of weight values of the plurality of neural network layers may be optimized by a learning result of the artificial intelligence model. For example, the plurality of weight values may be updated so that a loss value or a cost value obtained from the artificial intelligence model during the learning process is reduced or minimized.

The artificial neural network may include a deep neural network (DNN) and may be, for example, a convolutional neural network (CNN), a deep neural network (DNN), a recurrent neural network (RNN), a restricted Boltzmann machine (RBM), a deep belief network (DBN), a bidirectional recurrent deep neural network (BRDNN), a deep Q-network, etc. However, the artificial neural network is not limited to the above-mentioned examples.

The electronic apparatus 100 may further include a memory, a display, and a communication interface.

The memory may store an audio signal, an adaptive filter, an artificial intelligence model, etc. In addition, the memory may store various modules for obtaining an enduring component, various modules for processing an audio signal, etc.

The memory may be implemented as a non-volatile memory, a volatile memory, etc., but is not limited thereto. For example, a hard disk may be used instead of a memory, and any component capable of storing data may be used.

The display may be implemented in various forms such as a liquid crystal display (LCD), an organic light emitting diode (OLED) display, a plasma display panel (PDP), etc. The display my also include a driving circuit that may be implemented in the form of an amorphous silicon (a-Si) thin film transistor (TFT), a low temperature poly silicon (LTPS) TFT, an organic TFT (OTFT), etc., a backlight unit, etc. The display may be implemented as a touch screen in combination with a touch sensor, a flexible display, a three-dimensional (3D) display, etc.

The communication interface is configured to perform communication with various types of external devices according to various types of communication methods. The communication interface includes a wireless fidelity (Wi-Fi) module, a Bluetooth module, an infrared communication module, a wireless communication module, etc. Here, each communication module may be implemented in the form of at least one hardware chip.

The processor 120 may perform communication with various external devices using the communication interface. Here, the external devices may include a remote control device such as a remote controller, a display device such as a TV, an external server, a Bluetooth earphone etc.

The Wi-Fi module and the Bluetooth module perform communication through a Wi-Fi method and a Bluetooth method, respectively. When using the Wi-Fi module or the Bluetooth module, various connection information such as a service set identifier (SSID), a session key, etc. are exchanged to establish communication between the Wi-Fi module and the Bluetooth module, and various information may be transmitted and received based on the established communication.

The infrared communication module performs communication according to an infrared Data Association (IrDA)

technology using infrared light which lies between visible light and millimeter waves for short-distance wireless data transmission.

The wireless communication module may include at least one communication chip that performs communication according to various wireless communication standards such as Zigbee, 3rd generation (3G), 3rd generation partnership project (3GPP), long term evolution (LTE), LTE Advanced (LTE-A), 4th generation (4G), and 5th generation (5G), other than the above-described communication methods.

In addition, the communication interface may include at least one of a local area network (LAN) module, an Ethernet module, or a wired communication module that performs communication by using a pair cable, a coaxial cable, an optical fiber cable, or the like.

The communication interface may further include an input/output interface. The input/output interface may be one of a high definition multimedia interface (HDMI), a mobile high-definition link (MHL), a universal serial bus (USB), a display port (DP), thunderbolt, a video graphics array (VGA) port, an RGB port, a D-subminiature (D-SUB), and a digital visual interface (DVI).

The input/output interface may input/output at least one of an audio signal or a video signal.

According to an embodiment, the input/output interface may include a port for inputting/outputting only an audio signal and a port for inputting/outputting only a video signal, or may be implemented as one port that inputs/outputs both an audio signal and a video signal.

As described above, the electronic apparatus 100 may obtain an enduring component corresponding to an enduring noise around or about the electronic apparatus 100 from a received sound, and process an audio signal based on the enduring component.

Hereinafter, the operation of the processor 120 will be described in greater detail with reference to drawings. In the following drawings, individual embodiments will be described for convenience of explanation. However, the individual embodiments in the drawings may be implemented in any combination.

Figure 2:
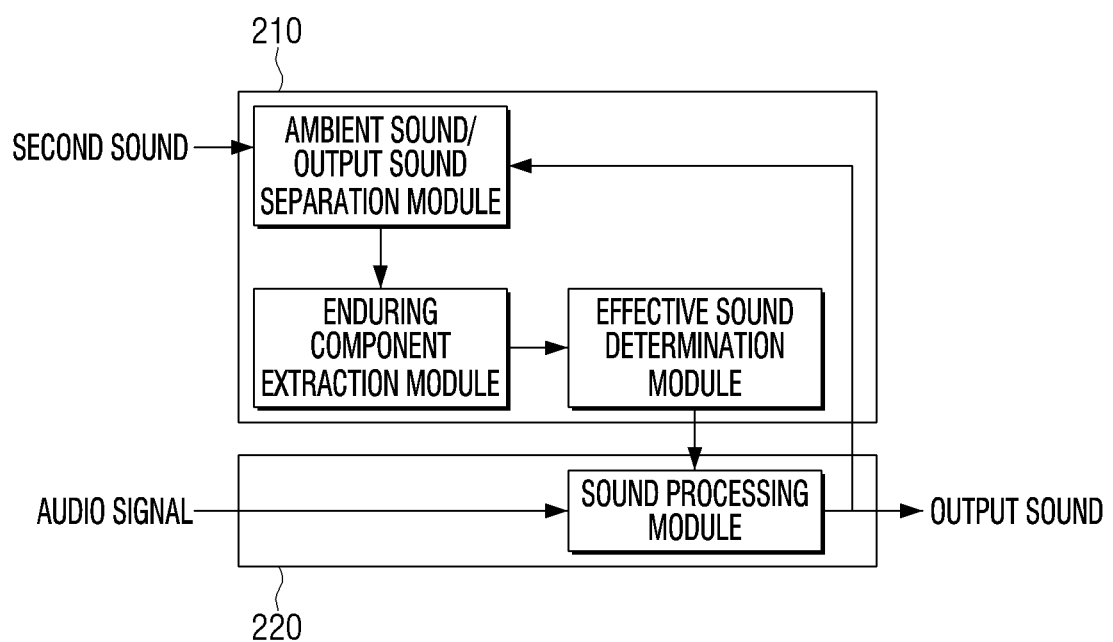
FIG. 2 is a view to explain a method of obtaining an enduring component according to an embodiment.

FIG. 2 is a view to explain a method of obtaining an enduring component according to an embodiment.

As illustrated in FIG. 2, an enduring component acquisition module 210 includes an ambient sound/output sound separation module, an enduring component extraction module, and an effective noise determination module, and the enduring component acquisition module 210 may provide information regarding an enduring component to a sound processing module 220.

The ambient sound/output sound separation module may separate an ambient sound (or noise) and an output sound from the second sound received from the microphone 110. Here, the second sound may be a sound including the first sound output through a speaker of the electronic apparatus 100 and a noise around or about the electronic apparatus 100. For example, the ambient sound/output sound separation module may be implemented as an adaptive filter or a filter using an artificial intelligence model.

The enduring component extraction module may determine whether a noise is enduring (or persistent), and obtain an enduring component corresponding to an enduring noise. For example, the enduring component extraction module may remove an instantaneous noise, and obtain only an enduring component corresponding to an enduring noise. Based on such an operation, the electronic apparatus 100 may be controlled according to an enduring noise (e.g., controlled to be insensitive to an instantaneous noise and sensitive to an enduring noise).

The enduring component extraction module may be implemented as a low-pass filter. Alternatively, the enduring component extraction module may be configured to obtain a plurality of noises corresponding to each of a plurality of time sections, and obtain a power of the smallest value from among a plurality of powers corresponding to the plurality of noises as an enduring component.

The effective noise determination module may perform a function of identifying whether an enduring component interferes with a user's hearing. For example, if an enduring component is greater than an output sound, the effective noise determination module may determine that the enduring component interferes with a user's hearing so that the sound processing module 220 may process an audio signal. In this case, the effective noise determination module may provide information that the enduring component interferes with the user's hearing and a degree of interference to the sound processing module 220.

The sound processing module 220 may output a sound by processing an audio signal based on information regarding an enduring component. The sound processing module 220 may perform voice component enhancement of the audio signal based on the enduring component.

Hereinafter, the operation of each module will be described in greater detail.

FIGS. 3A to 3D are views to explain an operation of obtaining a noise according to an embodiment. For convenience of explanation, it is described that the electronic apparatus 100 outputs the first sound corresponding to an audio signal (u) through a speaker 310 and receives the second sound through the microphone 110. In addition, it is described that the processor 120 obtains a noise by classifying a sound in time units of 64 ms.

Figure 3A:
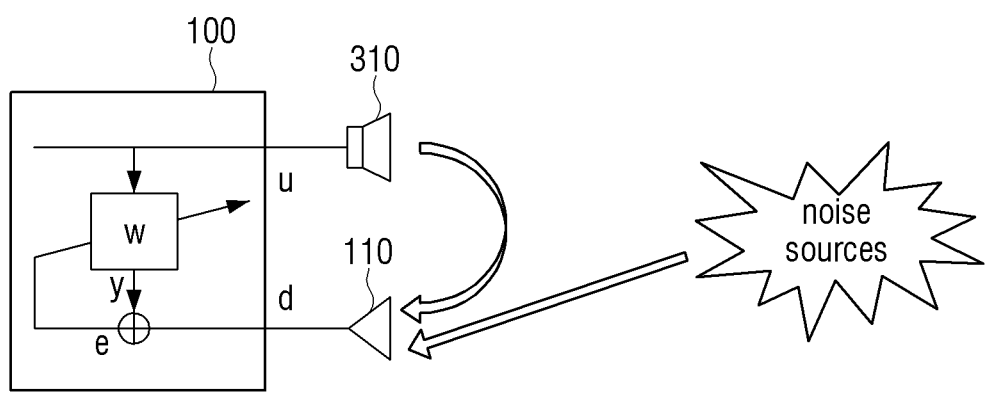
FIGS. 3A, 3B, 3C, and 3D are views to explain an operation of obtaining a noise according to an embodiment.

Firstly, as illustrated in FIG. 3A, the processor 120 may obtain a predicted sound signal (y) corresponding to the audio signal (u) by applying an adaptive filter to the audio signal (u), which may be expressed as follows.

$$y = w * u$$

Here, w may be a filter coefficient of the adaptive filter, which is a known technology. Thus, detailed description will be omitted.

The processor 120 may obtain a noise (e) by differentiating the predicted sound signal (y) from the audio signal (d) corresponding to the second sound received through the microphone 110 (or sound sensor), which may be expressed as follows.

$$e = d - y = d - w * u$$

Figure 3B:
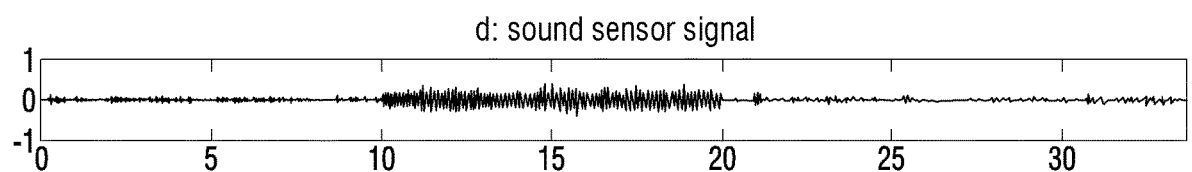
Figure 3C:
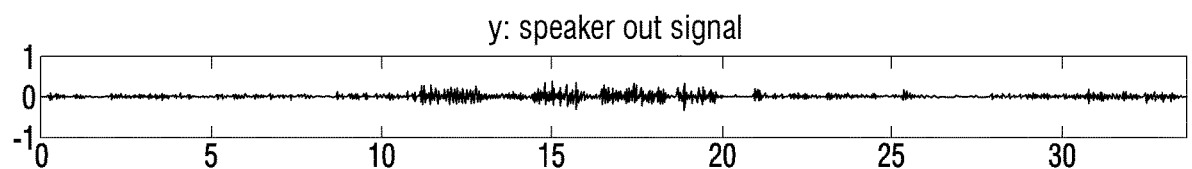
Figure 3D:
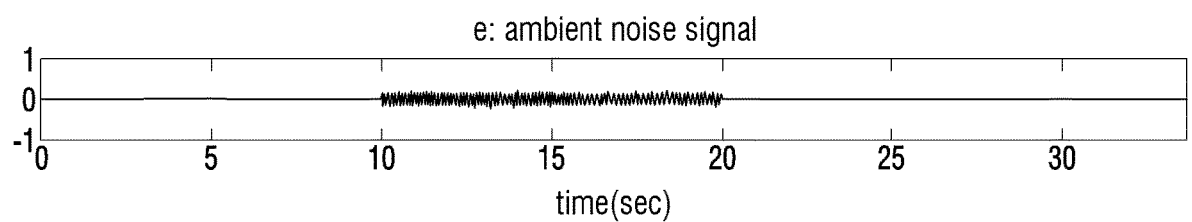

In the same manner as above, the processor 120 may obtain the audio signal (d) received through the microphone or the sound sensor, the predicted sound signal (y) and the noise (e), and examples of signals (d), (y) and (e) are illustrated in FIGS. 3B to 3D.

However, this is only an example, and there may be various methods of identifying a noise from a sound.

FIGS. 4A to 4D are views to explain a method of obtaining an enduring component according to an embodiment. For convenience of explanation, it is described that the processor 120 obtains a noise by classifying a sound in time units of 64 ms, and determines an enduring component using data of 15 time sections. In this case, a minimum of 15×64 ms=960 ms of a sound may be required to determine an enduring component.

Figure 4A:
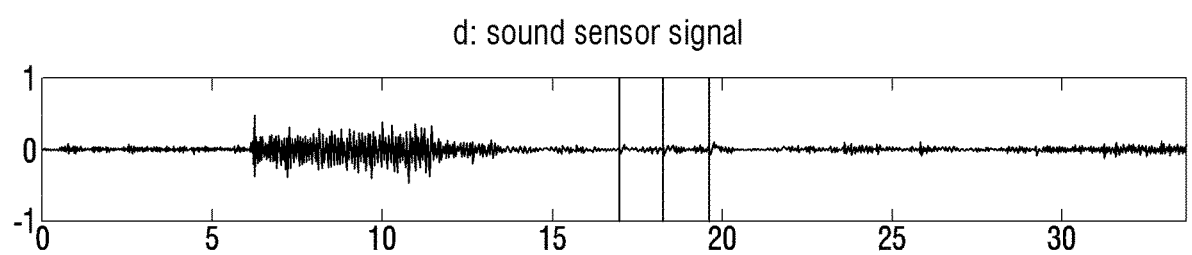
FIGS. 4A, 4B, 4C, and 4D are views to explain a method of obtaining an enduring component according to an embodiment.
Figure 4B:
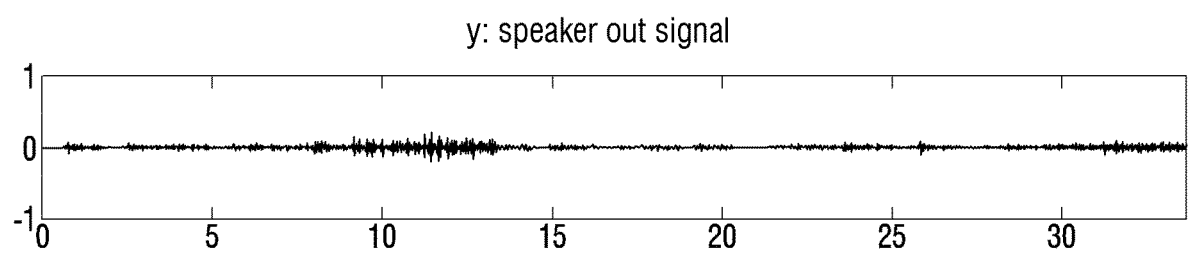
Figure 4C:
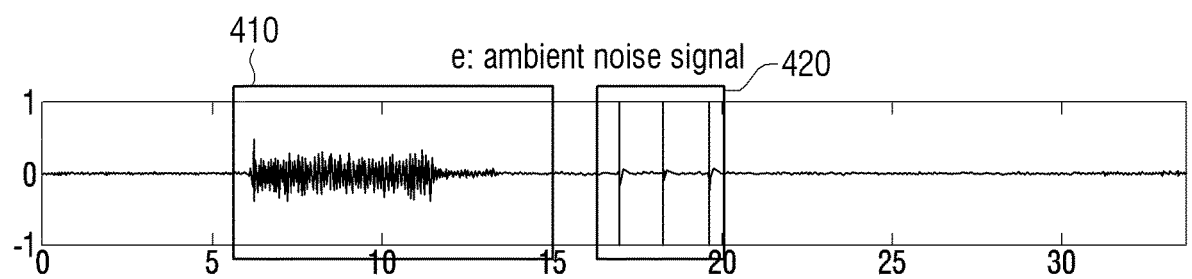

FIGS. 4A, 4B, and 4C illustrate example embodiments of signals (d), (y) and (e), and FIG. 4C illustrates a cleaner sound 410 in a section of 6~12 seconds and three clapping sounds 420 in a section of 17~20 seconds. The same method of acquiring the signals (d), (y) and (e) as described in FIGS. 3A to 3D may be used.

The processor 120 may obtain a plurality of noises in predetermined time units based on an audio signal and the second sound, and obtain an enduring component of the first time section which is the most recent time section based on one of the plurality of noises. The processor 120 may calculate a plurality of powers respectively corresponding to the plurality of noises, and obtain a power of the smallest value from among the plurality of powers as an enduring component of the first time section.

Subsequently, the processor 120 may obtain a noise in the second time section immediately after the first time section, calculate a power of the second time section from a noise of the second time section, and obtain a power of the smallest value from among powers excluding a power of the oldest time section and the power of the second time section from among the plurality of powers as an enduring component of the second time section. When the power of the second time section is calculated, the processor 120 may store the power of the second time section in the memory 110, and delete the power of the oldest time section from among the plurality of powers stored in the memory 110.

Figure 4D:
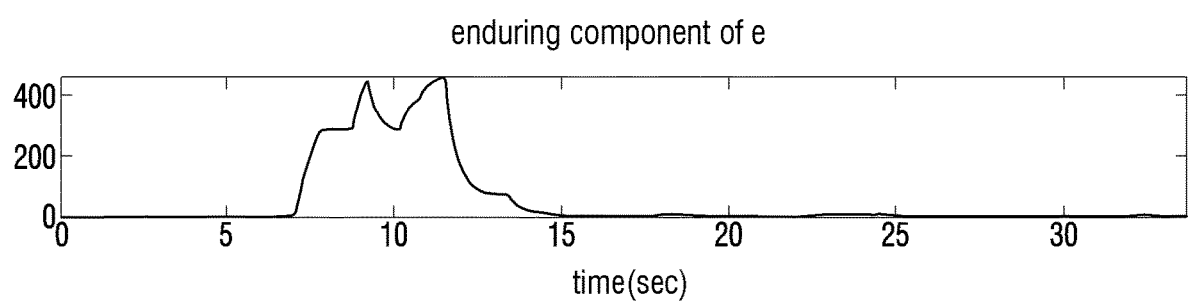

The processor 120 repeats such an operation whenever a new time section of the second sound arrives, and obtain an enduring component of each time section. FIG. 4D represents an enduring component obtained based on examples of signals (d), (y), (e) as in FIGS. 4A to 4C. In other words, the processor 120 may detect a cleaner sound 410 in the section of 6-12 seconds in which a continuous enduring component of a noise is included, and exclude three clapping sounds 420 in the section of 17~20 seconds which are an instantaneous noise from the enduring component.

Figure 5A:
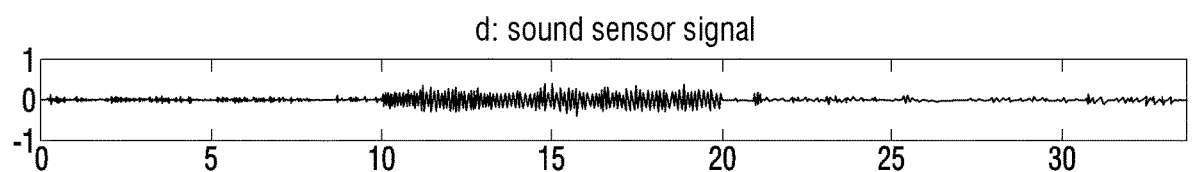
FIGS. 5A, 5B, 5C, 5D, 5E, and 5F are views to explain whether to process an audio signal based on an enduring component according to an embodiment.
Figure 5B:
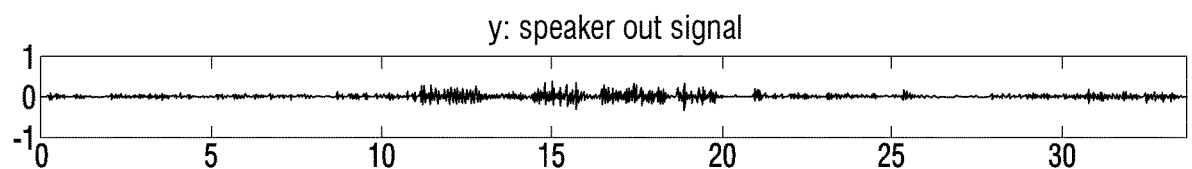
Figure 5C:
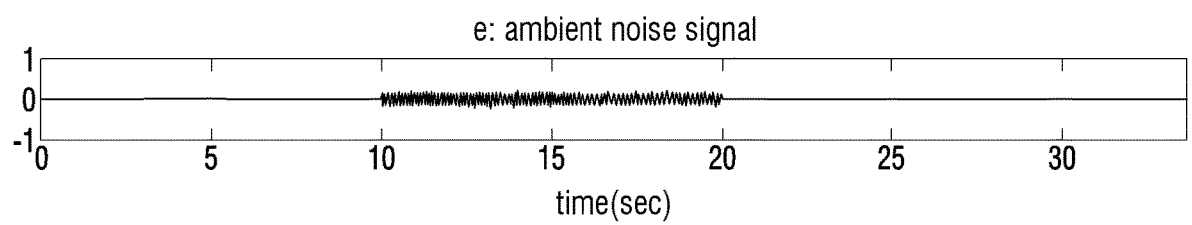

FIGS. 5A to 5F are views to explain whether to process an audio signal based on an enduring component according to an embodiment. For convenience of explanation, FIGS. 5A, 5B, and 5C illustrate the same examples in FIGS. 3B, 3C, and 3D, respectively. In addition, it is described that the audio signal is processed in response to an enduring component being identified as an effective noise.

The processor 120 may process an audio signal based on an enduring component. For example, if the enduring component is equal to or greater than a threshold value, the processor 120 may identify the enduring component as an effective noise and process the audio signal based on the enduring component. Alternatively, the processor 120 may process the audio signal by comparing the enduring component with an output sound. In other words, if it is identified that the enduring component interferes with a user's hearing according to a predetermined standard (e.g., if the enduring component is identified as an effective noise), the processor 120 may process the audio signal. The specific description regarding whether to process an audio signal will be provided later with reference to FIG. 6. However, this is only an example, and whether to process an audio signal may be determined in various methods.

Figure 5D:
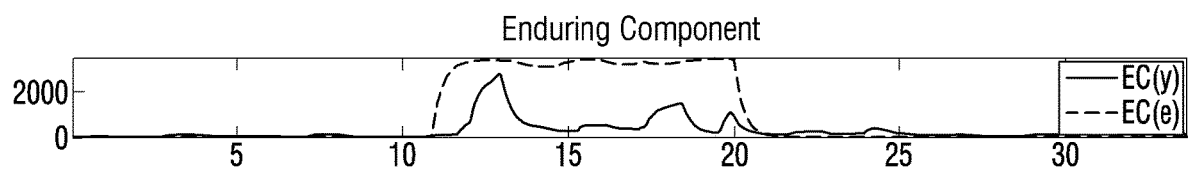
Figure 5E:
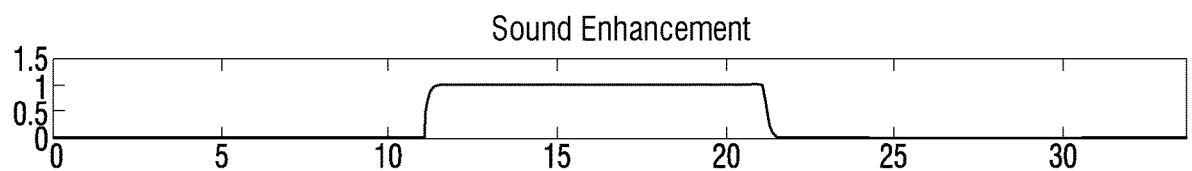

FIG. 5D is a view illustrating an enduring component in a dotted line and an output sound in a solid line according to an embodiment. FIG. 5E illustrates a case in which an effective noise is 1 and a non-effective noise is 0, which will be described later with reference to FIG. 6.

Figure 5F:
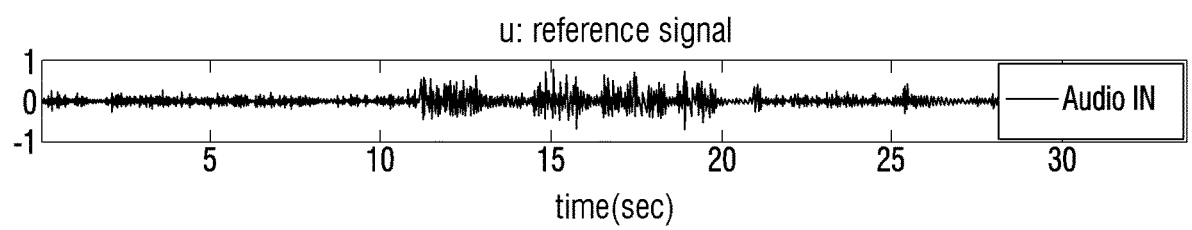
Figure 5F:
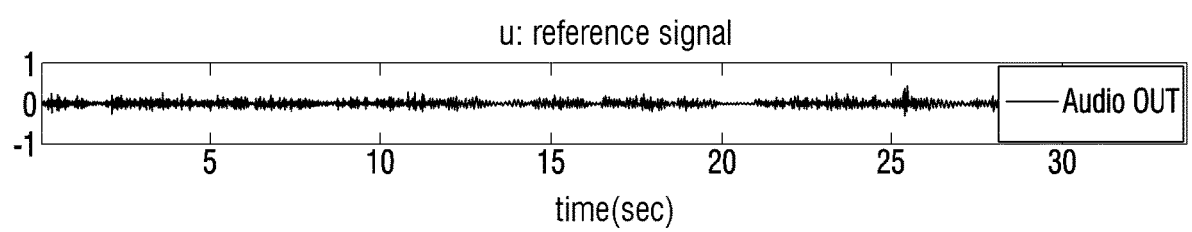

FIG. 5F is a view illustrating comparison between an input (dotted line) and an output (solid line) of an audio signal. FIG. 5F represents a result of channel redistribution and frequency enhancement processing for improving a transmission power, without increasing a volume of the audio signal. There may be a volume level increase after processing the audio signal, but the level of the audio signal may be limited to be within 6 dB.

Figure 6:
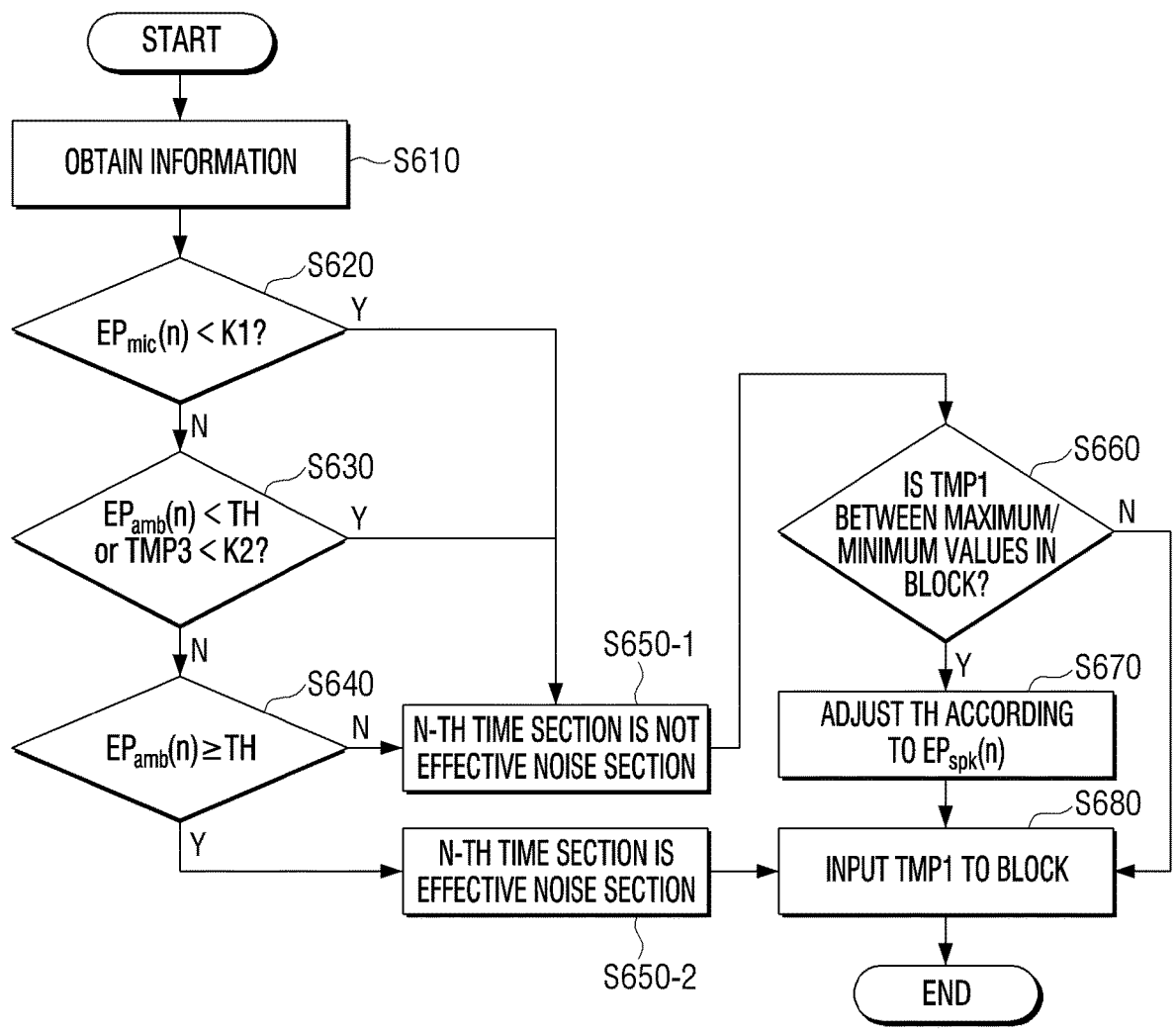
FIG. 6 is a flowchart to explain a method of identifying an effective noise according to an embodiment.

FIG. 6 is a flowchart to explain a method of identifying an effective noise according to an embodiment. For convenience of explanation, a plurality of time sections used to obtain an enduring component corresponding to an enduring noise will be described as a block.

The processor 120 may obtain relevant information (S610). For example, the processor 120 may obtain a first sound ($EP_{spk}(n)$), a second sound ($EP_{mic}(n)$), an expected sound (or predicted sound) ($EP_{ref}(n)$), and a noise ($EP_{amb}(n)$) of an n-th time section, and set a threshold value TH. After the threshold value TH is set, the threshold value TH may be updated. The first sound may be a sound obtained through a speaker, and the second sound may be a sound received through a microphone or a sound sensor.

The processor 120 may store $EP_{spk}(n)/EP_{ref}(n)$ as TMP1, store $EP_{spk}(n)/EP_{mic}(n)$ as TMP2 (or a non-effective noise), and store $EP_{amb}(n)/EP_{mic}(n)$ as TMP3 (or an effective noise).

The processor 120 may identify whether the second sound $EP_{mic}(n)$ corresponding to the n-th time section is smaller than K1 (S620). If the second sound $EP_{mic}(n)$ is smaller than K1, the processor 120 may identify that the n-th time section is not an effective noise section (S650-1). That is, the processor 120 may determine that the second sound received through the microphone 110 is very small, and there is no need to process an audio signal. K1 may be a predetermined value. In another example, the processor 120 may compare the second sound $EP_{mic}(n)$ with the noise $EP_{amb}(n)$ or the first sound $EP_{spk}(n)$ other than K1.

If the second sound $EP_{mic}(n)$ is not smaller than K1, the processor 120 may identify whether the noise $EP_{amb}(n)$ is smaller than the threshold value TH or whether TMP3 is smaller than K2 (S630). If the noise $EP_{amb}(n)$ is smaller than the threshold value TH or TMP3 is smaller than K2, the processor 120 may identify that the n-th time section is not an effective noise section (S650-1). That is, the processor 120 may determine that the noise is very small, and there is no need to process the audio signal. K2 may be a predetermined value.

If the noise $EP_{amb}(n)$ is not smaller than the threshold value TH or TMP3 is not smaller than K2, the processor 120 may identify whether the noise $EP_{amb}(n)$ is equal to or greater than the threshold value TH (S640). If the noise $EP_{amb}(n)$ is less than the threshold value TH, the processor 120 may identify that the n-th time section is not an effective noise section (S650-1). That is, the processor 120 may determine that the noise is very small, and there is no need to process the audio signal. In addition, the processor 120 may identify whether the noise is significant by further considering whether TMP2 is close to 0 and TMP3 is close to 1.

If the noise $EP_{amb}(n)$ is less than the threshold value TH, the processor 120 may identify that the n-th time section is not an effective noise section (S650-1). If the noise $EP_{amb}(n)$ is equal to or greater than the threshold value TH, the processor 120 may identify that the n-th time section is an effective noise section (S650-2).

When it is identified that the n-th time section is not an effective noise section, the processor 120 may identify whether TMP1 is between the maximum value and the minimum value in a block (S660). If it is identified that TMP1 is between the maximum and the minimum values in a block, the processor 120 may adjust the threshold value TH based on $EP_{spk}(n)$ (S670), and input TMP1 to the block. If it is identified that TMP1 is not between the maximum and the minimum values in the block, the processor 120 may skip adjusting the threshold value TH based on $EP_{spk}(n)$, and input TMP1 to the block (S680).

If it is identified that the n-th time section is an effective noise section, the processor 120 may input TMP1 to the block (S680).

The processor 120 may identify an effective noise section by repeating the above operation for each time section.

Figure 7:
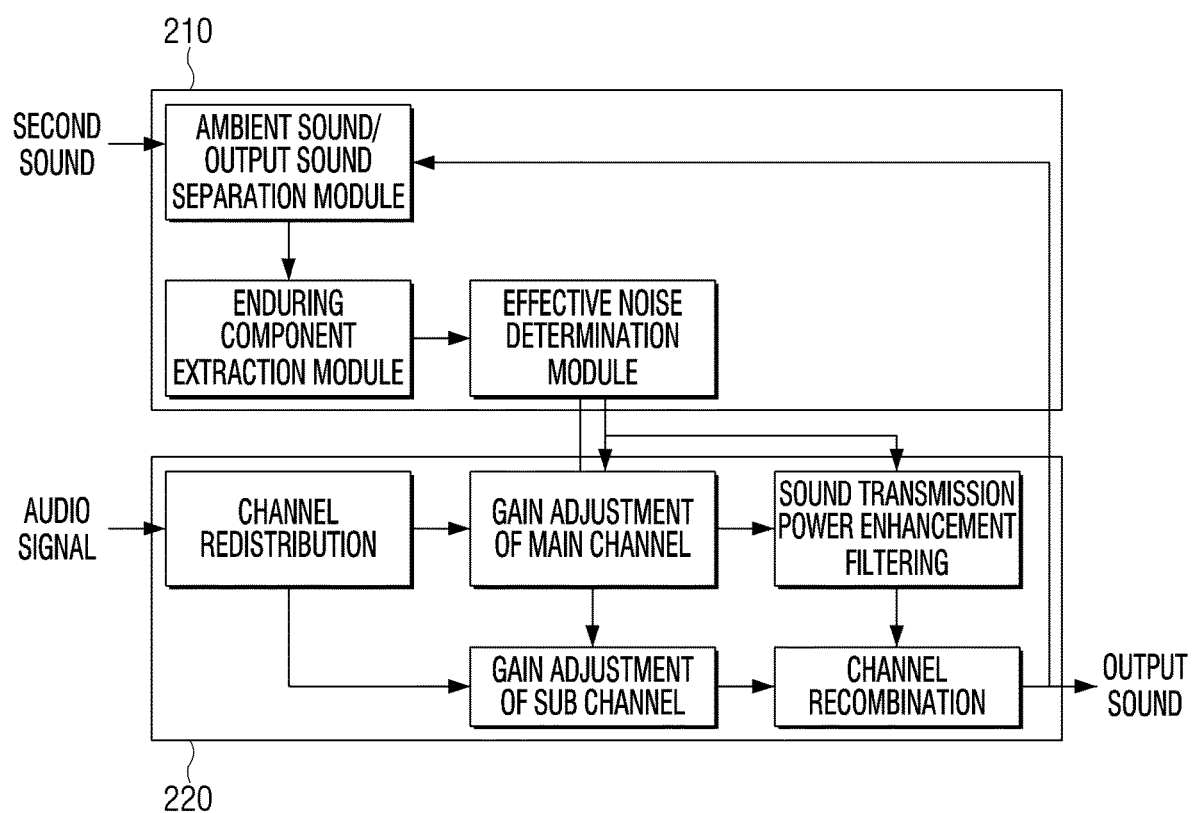
FIG. 7 is a view to explain a method of processing an audio signal according to an embodiment.

FIG. 7 is a view to explain a method of processing an audio signal according to an embodiment. The operation of the enduring component acquisition module 210 has been described above and thus, overlapping description will be omitted.

If an audio signal includes a stereo or a plurality of channels, the processor 120 may distinguish a channel (or main channel) that is important for a transmission power and a channel (or sub channel) that is not important, through channel redistribution, and emphasize a band that may strengthen a transmission power of a signal of a channel that is important for the transmission power. In other words, the processor 120 may strengthen the transmission power of the audio signal without increasing the volume of the audio signal.

Subsequently, the processor 120 may output a sound by recombining a plurality of channels.

Alternatively, the processor 120 may strengthen the transmission power of the audio signal by reflecting a location of a user. For example, if the location of the user is within a predetermined distance from the electronic apparatus 100, the processor 120 may strengthen the transmission power of the audio signal to a first level, and if the location of the user is outside the predetermined distance from the electronic apparatus 100, the processor 120 may strengthen the transmission power of the audio signal to a second level which is greater than the first level. In addition or alternatively, the processor 120 may strengthen the transmission power of the audio signal differently for each frequency of the audio signal.

FIG. 8 is a flowchart to explain a controlling method of an electronic apparatus according to an embodiment.

Firstly, the second sound including the first sound of an audio signal is received (S810). The first sound may be a sound obtained through a speaker, and the second sound may be a sound received through a microphone or a sound sensor. A noise around or about an electronic apparatus is obtained based on the audio signal included in the second sound and the second sound (S820). An enduring component corresponding to a noise that persists around or about the electronic apparatus is obtained based on the noise (S830). If the enduring component is equal to or greater than a threshold value, the audio signal is processed based on the enduring component (S840).

Here, the obtaining a noise (S820) may include obtaining a plurality of noises in predetermined units of time based on the audio signal and the second sound, and the obtaining an enduring component (S830) may include obtaining an enduring component of the first time section that is the most recent time section based on one of the plurality of noises.

The obtaining an enduring component (S830) may include calculating a plurality of powers respectively corresponding to the plurality of noises and obtaining a power of the smallest value from among the plurality of powers as the enduring component of the first time section.

Here, the controlling method according to an embodiment may further include obtaining a noise in the second time section immediately after the first time section, calculating a power of the second time section from the noise of the second time section and obtaining a power of the smallest value from powers excluding a power of the oldest time section from among the plurality of powers and the power of the second time section as the enduring component of the second time section.

Additionally, the controlling method according to an embodiment may further include storing the power of the second time section in a memory of the electronic apparatus and deleting a power of the oldest time section from among the plurality of powers in the memory.

Additionally, the controlling method according to an embodiment may further include outputting the first sound through a speaker of the electronic apparatus may be further included.

Here, the obtaining a noise (S820) may include obtaining a predicted sound corresponding to the audio signal by applying an adaptive filter to the audio signal and obtaining a noise by differentiating the predicted sound from the second sound, and the adaptive filter may be a filter obtained based on a relationship between an output sound of the speaker and an input sound input to a microphone of the electronic apparatus.

In addition, the obtaining a noise (S820) may further include changing the threshold value based on at least one of the firs sound, the second sound, the predicted sound or the noise.

The processing an audio signal (S840) may further include performing at least one of channel redistribution of the audio signal, gain control of at least one of a plurality of channels or voice component enhancement, and the controlling method may further include outputting the third sound corresponding to the processed audio signal through the speaker.

The controlling method according to an embodiment may further include, if the enduring component obtained while the third sound is output is less than the threshold value, stopping or changing the processing of the audio signal.

According to the above-described various embodiments, the electronic apparatus may obtain an enduring component of a noise from a sound that is currently received and improve the transmission power of the audio signal adaptively as an audio signal is processed based on the obtained enduring component.

In other words, the electronic apparatus solves the problem that a user's hearing of the audio signal is interrupted by an enduring noise while ignoring an instantaneous noise. In particular, the instantaneous noise has little impact on the user's hearing of the audio signal, and thus, the controlling apparatus may have the effect of reducing power consumption of the electronic apparatus by ignoring the instantaneous noise (that is, not processing the audio signal based on the instantaneous noise).

In addition, the electronic apparatus is capable of adaptively processing the audio signal according to various situations based on a current state of an output sound. For example, if the volume of the current output sound is large, the audio signal is processed if there is a large effective noise. On the other hand, if the volume of the current output sound is small, the audio signal may be processed even if there is a small effective noise.

According to an embodiment, the above-described various embodiments may be implemented by software including instructions that are stored in machine-readable storage media (e.g., a computer). The machine is an apparatus that invokes the stored instructions from the storage media and is operable according to the invoked instructions, and may include the electronic apparatus (e.g., an electronic apparatus) according to embodiments. When the instructions are executed by a processor, the processor may perform functions corresponding to the instructions, either directly or using other components under the control of the processor. The instructions may include codes generated or executed by a compiler or an interpreter. The machine-readable storage media may be provided in the form of non-transitory storage media. Here, the term 'non-transitory' means that the storage medium does not include a signal per se and is tangible, but does not distinguish whether data is stored semi-permanently or temporarily in the storage medium The method according to diverse embodiments may be provided as being included in a computer program product. The computer program product may be traded as a product between a seller and a purchaser. The computer program product may be distributed in the form of a machine readable storage media (e.g., a compact disc read only memory (CD-ROM)), or online through an application store (e.g., PlayStore™). In the case of the online distribution, at least a portion of the computer program product may be at least temporarily stored in a storage medium such as a memory of a server of a manufacturer, a server of an application store, or a relay server, or be temporarily generated.

In addition, the diverse embodiments described above may be implemented in a computer or an apparatus similar to the computer using software, hardware, or a combination of software and hardware. In some cases, embodiments described in the disclosure may be implemented by a processor itself. According to a software implementation, embodiments such as procedures and functions described in the specification may be implemented by separate software modules. Each of the software modules may perform one or more functions and operations described in the disclosure.

Computer instructions for performing processing operations according to the diverse embodiments of the disclosure described above may be stored in a non-transitory computer-readable medium. The computer instructions stored in the non-transitory computer-readable medium may cause a processor of a specific device to perform the processing operations of the display apparatus according to the diverse embodiments described above when the computer instructions are executed by the processor of the specific device. The non-transitory computer-readable medium may not be a medium that temporarily stores data, such as a register, a cache, a memory, or the like, but means a medium that semi-permanently stores data and is readable by the device. Specific examples of the non-transitory computer-readable medium may include a compact disk (CD), a digital versatile disk (DVD), a hard disk, a Blu-ray disk, a USB, a memory card, a ROM, and the like.

Each of the components (e.g., modules or programs) according to the diverse embodiments may include a single entity or a plurality of entities, and some sub-components of the sub-components described above may be omitted, or other sub-components may be further included in the diverse embodiments. Alternatively or additionally, some components (e.g., modules or programs) may be integrated into one entity to perform the same or similar functions performed by the respective components prior to the integration. The operations performed by the module, the program, or other component, in accordance with the diverse embodiments may be executed in a sequential, parallel, iterative, or heuristic manner, or at least some operations may be executed in a different order or omitted, or other operations may be added.

According to the above-described various embodiments, the electronic apparatus may obtain an enduring component of a noise from a sound that is currently received and adaptively improve transmission power of the audio signal by processing an audio signal based on the obtained enduring component.

At least one of the components, elements, modules or units described herein may be embodied as various numbers of hardware, software and/or firmware structures that execute respective functions described above, according to an example embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the block diagrams, communication between the components, elements or units may be performed through the bus. Functional aspects of the above example embodiments may be implemented in algorithms that execute on one or more processors. Furthermore, the components, elements or units represented by a block or processing operations may employ any number of related art techniques for electronics configuration, signal processing and/or control, data processing and the like.

Although a few embodiments have been shown and described, it would be appreciated by those skilled in the art that changes may be made in embodiments without departing from the principles and spirit of the disclosure, the scope of which is defined in the claims and their equivalents.

What is claimed is:

1. An electronic apparatus comprising:
a microphone; and
a processor configured to:
based on a second sound, including a first sound of an audio signal, being received through the microphone, obtain a noise about the electronic apparatus based on the audio signal and the second sound;
obtain an enduring component of the noise; and
based on the enduring component being equal to or greater than a threshold value, process the audio signal,
wherein the processor is further configured to:
obtain a plurality of noises corresponding to a plurality of time sections based on the audio signal and the second sound; and
obtain an enduring component of a first time section, among the plurality of time sections, that is a most recent time section, based on the plurality of noises.

2. The electronic apparatus as claimed in claim 1, wherein the processor is further configured to obtain a plurality of powers respectively corresponding to the plurality of noises, and obtain a power having a smallest value from among the plurality of powers as the enduring component of the first time section.

3. The electronic apparatus as claimed in claim 2, further comprising:
a memory configured to store information on the plurality of powers,
wherein the processor is further configured to:
obtain a noise in a second time section, the second time section being immediately after the first time section;
obtain a power of the second time section based on the noise in the second time section; and
obtain, as an enduring component of the second time section, a power having a smallest value from powers excluding a power of an oldest time section from among the plurality of powers stored in the memory and a power of the second time section.

4. The electronic apparatus as claimed in claim 3, wherein the processor is further configured to:
store the power of the second time section in the memory; and
delete the power of the oldest time section from among the plurality of powers stored in the memory.

5. The electronic apparatus as claimed in claim 1, further comprising:
a speaker,
wherein the processor is further configured to output the first sound through the speaker.

6. The electronic apparatus as claimed in claim 5, wherein the processor is further configured to:
obtain a predicted sound corresponding to the audio signal by applying an adaptive filter to the audio signal; and
obtain the noise by subtracting the predicted sound from the second sound,
wherein the adaptive filter is obtained based on a relation between an output sound of the speaker and an input sound of the microphone.

7. The electronic apparatus as claimed in claim 6, wherein the processor is further configured to change the threshold value based on at least one of the first sound, the second sound, the predicted sound, or the noise.

8. The electronic apparatus as claimed in claim 1, wherein the processor is further configured to:
based on the enduring component being equal to or greater than the threshold value, process the audio signal by performing at least one of channel redistribution of the audio signal, gain adjustment of at least one of a plurality of channels, or enhancement of a voice component; and
output a third sound corresponding to the processed audio signal.

9. The electronic apparatus as claimed in claim 8, wherein the processor is further configured to, based on an enduring component obtained while the third sound is output being less than the threshold value, stop or change processing of the audio signal.

10. A method of controlling an electronic apparatus, comprising:
receiving a second sound, including a first sound of an audio signal;
obtaining a noise about the electronic apparatus based on the audio signal and the second sound;
obtaining an enduring component based on the noise; and
based on the enduring component being equal to or greater than a threshold value, processing the audio signal,
wherein the obtaining the noise comprises obtaining a plurality of noises corresponding to a plurality of time sections based on the audio signal and the second sound, and
wherein the obtaining the enduring component comprises obtaining an enduring component of a first time section, among the plurality of time sections, that is a most recent time section, based on the plurality of noises.

11. The method as claimed in claim 10, wherein the obtaining an enduring component comprises obtaining a plurality of powers respectively corresponding to the plurality of noises, and obtaining a power having a smallest value from among the plurality of powers as the enduring component of the first time section.

12. The method as claimed in claim 11, further comprising:
obtaining a noise in a second time section, the second time section being immediately after the first time section;
obtaining a power of the second time section based on the noise in the second time section; and
obtaining, as an enduring component of the second time section, a power having a smallest value from powers excluding a power of an oldest time section from among the plurality of powers and a power of the second time section.

13. The method as claimed in claim 12, further comprising:
storing the power of the second time section in a memory of the electronic apparatus; and
deleting the power of the oldest time section from among the plurality of powers stored in the memory.

14. The method as claimed in claim 10, further comprising:
outputting the first sound through a speaker of the electronic apparatus.

15. The method as claimed in claim 14, wherein the obtaining the noise comprises:
obtaining a predicted sound corresponding to the audio signal by applying an adaptive filter to the audio signal; and
obtaining the noise by subtracting the predicted sound from the second sound,
wherein the adaptive filter is obtained based on a relation between an output sound of the speaker and an input sound of a microphone of the electronic apparatus.

16. The method as claimed in claim 15, wherein the obtaining the noise further comprises changing the threshold value based on at least one of the first sound, the second sound, the predicted sound, or the noise.

17. The method as claimed in claim 10, wherein the processing the audio signal comprise performing at least one of channel redistribution of the audio signal, gain adjustment of at least one of a plurality of channels, or enhancement of a voice component,
the method further comprising outputting a third sound corresponding to the processed audio signal.

18. The method as claimed in claim 17, further comprising:
based on an enduring component obtained while the third sound is output being less than the threshold value, stopping or changing the processing the audio signal.

* * * * *